(12) United States Patent
Lee et al.

(10) Patent No.: US 8,987,773 B2
(45) Date of Patent: Mar. 24, 2015

(54) ORGANIC LIGHT EMITTING DIODE DISPLAY

(71) Applicant: Samsung Display Co., Ltd., Yongin, Gyeonggi-Do (KR)

(72) Inventors: Hae-Yeon Lee, Yongin (KR); Jin-Gon Oh, Yongin (KR); Jung-Bae Kim, Yongin (KR); Jong-Hyun Choi, Yongin (KR); Keum-Nam Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/027,167

(22) Filed: Sep. 14, 2013

(65) Prior Publication Data
US 2014/0097420 A1 Apr. 10, 2014

(30) Foreign Application Priority Data
Oct. 8, 2012 (KR) .......................... 10-2012-0111341

(51) Int. Cl.
*H01L 33/00* (2010.01)
*H01L 27/32* (2006.01)
(52) U.S. Cl.
CPC ........ *H01L 27/3279* (2013.01); *H01L 27/3276* (2013.01)
USPC .................................... 257/99; 257/E51.019
(58) Field of Classification Search
CPC .......................... H01L 27/3279; H01L 27/3297
USPC .................................................. 257/E51.019
See application file for complete search history.

(56) References Cited

U.S. PATENT DOCUMENTS

| 2007/0120473 | A1* | 5/2007 | Nakamura et al. | 313/506 |
| 2008/0287028 | A1* | 11/2008 | Ozawa | 445/24 |
| 2009/0128023 | A1* | 5/2009 | Kwak et al. | 313/504 |
| 2011/0133215 | A1* | 6/2011 | Kang et al. | 257/88 |
| 2011/0241562 | A1* | 10/2011 | Choi et al. | 315/291 |
| 2013/0093654 | A1* | 4/2013 | Park et al. | 345/82 |
| 2013/0306938 | A1* | 11/2013 | Lee et al. | 257/40 |

FOREIGN PATENT DOCUMENTS

| KR | 10-0501427 | 7/2005 |
| KR | 10-0658292 | 12/2006 |
| KR | 10-2011-0019498 | 2/2011 |
| KR | 10-2011-0130949 | 12/2011 |

* cited by examiner

*Primary Examiner* — Daniel Luke
(74) *Attorney, Agent, or Firm* — Robert E. Bushnell, Esq.

(57) ABSTRACT

An organic light emitting diode display includes: a pixel region; and a peripheral region surrounding the pixel region, the peripheral region including: a gate common voltage line; an interlayer insulating film that covers the gate common voltage line and has a common voltage contact hole exposing part of the gate common voltage line; a data common voltage line that is formed on the interlayer insulating film and comes in contact with the gate common voltage line via the common voltage contact hole; barrier ribs that cover the data common voltage line and have common voltage openings exposing part of the data common voltage line; and a peripheral common electrode that is formed on the barrier ribs and comes in contact with the data common voltage line via the common voltage openings, wherein the barrier ribs are formed at positions corresponding to the boundaries with the common voltage contact hole.

11 Claims, 8 Drawing Sheets

ORGANIC LIGHT EMITTING DIODE DISPLAY

CLAIM PRIORITY

This application makes reference to, incorporates the same herein, and claims all benefits accruing under 35 U.S.C. §119 from an application earlier filed in the Korean Intellectual Property Office on 8 Oct. 2012 and there duly assigned Serial No 10-2012-0111341.

BACKGROUND OF THE INVENTION

1. Field of the Invention

The described technology relates generally to an organic light emitting diode display.

2. Description of the Related Art

An organic light emitting diode display includes two electrodes and an organic emission layer interposed between the two electrodes. Electrons injected from a cathode, which is one of the electrodes, and holes injected from an anode, which is the other electrode, are combined in the organic light emitting layer to form excitons. The excitons release energy, thereby causing light to be emitted.

The above information disclosed in this Related Art section is only for enhancement of understanding of the background of the described technology and therefore it may contain information that does not form the prior art that is already known in this country to a person of ordinary skill in the art.

SUMMARY OF THE INVENTION

The described technology has been made in an effort to provide an organic light emitting diode display capable of making the contact area between a gate common voltage contact portion and a data common voltage contact portion as large as possible and preventing short-circuiting of a common electrode.

An exemplary embodiment provides an organic light emitting diode display including: a pixel region formed on a substrate and including an organic light emitting diode for displaying an image; and a peripheral region surrounding the pixel region, the peripheral region including: a gate common voltage line formed on the substrate and transmitting a common voltage from an external source; an interlayer insulating film that covers the gate common voltage line and has a common voltage contact hole exposing part of the gate common voltage line; a data common voltage line that may be formed on the interlayer insulating film and comes in contact with the gate common voltage line via the common voltage contact hole; barrier ribs that cover the data common voltage line and have common voltage openings exposing part of the data common voltage line; and a peripheral common electrode that is formed on the barrier ribs and comes in contact with the data common voltage line via the common voltage openings, wherein the barrier ribs are formed at positions corresponding to the boundaries with the common voltage contact hole.

The common voltage openings include: a first common voltage opening formed inside the common voltage contact hole; and a second common voltage opening formed outside the common voltage contact hole.

A gate common voltage contact portion, which may be a part of the gate common voltage line, and a data common voltage contact portion, which may be a part of the data common voltage line, are connected to each other via the common voltage contact hole.

A first common electrode contact portion and a second common electrode contact portion, which are part of the peripheral common electrode, are connected to the data common voltage contact portion via the first common voltage opening and the second common voltage opening.

The barrier ribs include: a first barrier rib overlapping an end portion of the data common voltage contact portion; and a second barrier rib overlapping an end portion of the gate common voltage contact portion, and the first common voltage opening may be formed between the first barrier rib and the second barrier rib, and the second common voltage opening may be formed between the second barrier rib and the pixel region.

The end portion of the data common voltage contact portion and the end portion of the gate common voltage contact portion are formed at positions corresponding to the boundaries with the common voltage contact hole.

The common voltage openings may be positioned in a corner portion of the peripheral region.

The common voltage openings may be positioned in an edge portion of the peripheral region.

The pixel region includes: a gate line that may be formed on the substrate and transmitting scan signals; a data line and a driving voltage line that are insulated from and intersect the gate line and transmit data signals and driving voltages, respectively; a switching thin film transistor connected to the gate line and the data line; a driving thin film transistor connected to the switching thin film transistor and the driving voltage line; a pixel electrode connected to the driving thin film transistor; an organic light emitting diode formed on the pixel electrode; and a common electrode formed on the organic light emitting diode, wherein the gate common voltage line may be formed on the same layer as the gate line, and the data common voltage line may be formed on the same layer as the data line.

The common electrode and the peripheral common electrode may be connected to each other.

A width of the common voltage contact hole may be larger than a width of the first common voltage opening.

The organic light emitting diode display according to an exemplary embodiment makes the contact area between the data common voltage contact portion and the peripheral common electrode as large as possible by connecting the data common voltage contact portion and the peripheral common electrode together by using the first common voltage opening formed inside the common voltage contact hole and the second common voltage opening formed outside the common voltage contact hole.

Accordingly, the contact resistance between the data common voltage contact portion and the peripheral common electrode becomes as small as possible to thereby minimize heat generation. This minimizes voltage drop IR DROP, thus improving picture quality.

Moreover, since the barrier ribs are formed at positions corresponding to the boundaries with the common voltage contact hole, thereby preventing short-circuiting of the peripheral common electrode due to an abrupt taper at the boundary with the common voltage contact hole.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In order to clarify the description of the disclosed embodiments, elements extrinsic to their description are omitted. Further, like reference numerals refer to like elements throughout the application.

In addition, the sizes and thicknesses of the elements in the drawings are not necessarily to scale, but rather for better understanding and ease of description. The present invention is not limited thereto.

In the drawings, the thickness of layers, films, panels, regions, etc., are exaggerated for clarity. In the drawings, the thicknesses of layers and regions are exaggerated for convenience of explanation. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. In addition, "on" is either positioned on or below a portion of a target or positioned on the upper side based on a gravity direction, throughout the specification.

Each pixel of an organic light emitting diode display includes a switching thin film transistor, a driving thin film transistor, a capacitor, and an organic light emitting diode. A driving voltage ELVDD is supplied from a driving voltage line to the driving thin film transistor and the capacitor, and the driving thin film transistor serves to control the current flowing to the organic light emitting diode through the driving voltage line. A common voltage line supplies a common voltage ELVSs to the cathode and forms a potential difference between a pixel electrode as an anode and a common electrode, thereby causing a current to between the pixel electrode and the common electrode.

The common voltage ELVSS is transferred to the common electrode formed on barrier ribs by continuous contact among a gate common voltage contact portion including gate lines formed in a peripheral region, a data common voltage contact portion including data lines, and the common electrode.

To make the contact resistance of the common voltage as small as possible, a common voltage contact hole for connecting the gate common voltage contact portion and the data common voltage contact portion may be formed in a large size, and a common voltage opening for connecting the data common voltage contact portion and the common voltage has a size as large as possible, thereby making the contact area between the gate common voltage contact portion and the data common voltage contact portion and the contact area between the data common voltage contact portion and the common voltage as large as possible.

However, if the common voltage contact hole is smaller than the common voltage opening, the common electrode may be short-circuited due to an abrupt taper at the boundary with the common voltage contact hole in a non-overlapping region between the data common voltage contact portion and the gate common voltage contact portion.

To prevent this, the common voltage opening is formed to be smaller than the common voltage contact hole so that the taper of the common voltage contact hole has a gentle slope. In this case, however, the contact area between the data common voltage contact portion and the common area decrease, and the current density increases, thus causing heat generation.

Figure 1:
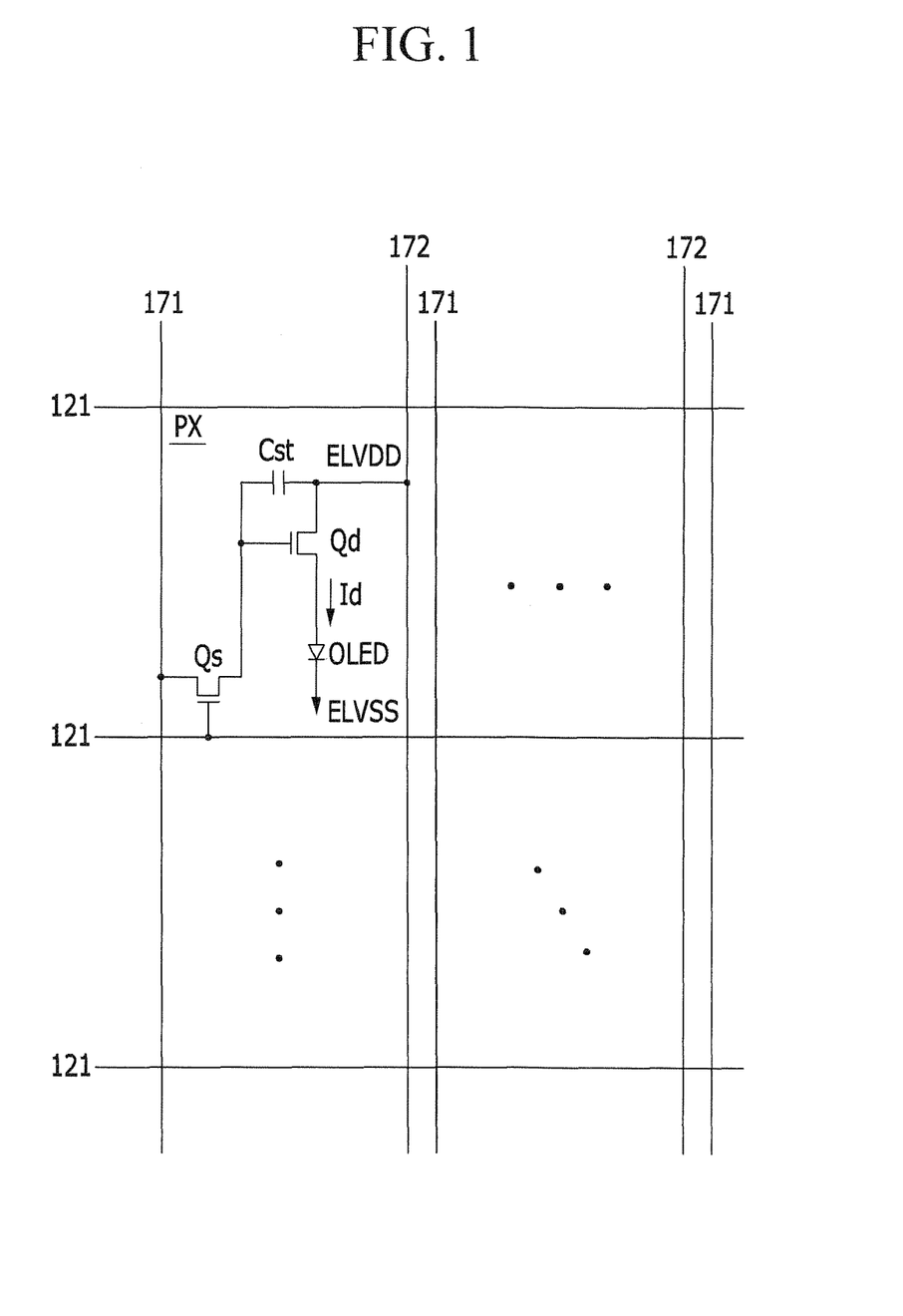
FIG. 1 is an equivalent circuit diagram of an organic light emitting diode display according to an exemplary embodiment.

FIG. 1 is an equivalent circuit diagram of an organic light emitting diode display according to an exemplary embodiment.

Referring to FIG. 1, the organic light emitting diode display according to an exemplary embodiment includes a plurality of signal lines 121, 171, and 172 and a plurality of pixels PX connected to these signal lines and arranged substantially in a matrix.

The signal lines include a plurality of gate lines 121 for transmitting scan signals (or gate lines), a plurality of data lines 171 for transmitting data signals, and a plurality of driving voltage lines 172 for transmitting driving voltages ELVDD. The gate lines 121 extend substantially in a row direction and substantially parallel to each other, while the data lines 171 and the driving voltage lines 172 extend substantially in a column direction and substantially parallel to each other.

Each pixel PX includes a switching thin film transistor Qs, a driving thin film transistor Qd, a storage capacitor Cst, and an organic light emitting diode OLED.

The switching transistor Qs has a control terminal coupled to one of the gate lines 121, an input terminal coupled to one of the data lines 171, and an output terminal coupled to the driving transistor Qd. The switching transistor Qs transmits data signals applied to the data lines 171 to the driving transistor Qd in response to scan signals applied to the gate lines 121.

The driving transistor Qd has a control terminal coupled to the switching transistor Qs, an input terminal coupled to the driving signal line 172, and an output terminal coupled to the organic light emitting diode OLED. The driving transistor Qd drives an output current Id having a magnitude that varies according to the voltage applied between the control terminal and the input terminal.

The capacitor Cst may be coupled between the control terminal and the input terminal of the driving transistor Qd. The capacitor Cst stores the data signal applied to the control terminal of the driving transistor Qd and sustains it after the switching transistor Qs is turned off.

The organic light emitting diode OLED includes an anode connected to the output terminal of the driving transistor Qd and a cathode connected to a common voltage ELVSS. The organic light emitting diode OLED displays images by emitting light with different intensities according to the output current Id of the driving transistor Qd.

The switching transistor Qs and the driving transistor Qd are n-channel field effect transistors FETs. However, at least one of the switching transistor Qs or the driving transistor Qd may be a p-channel field effect transistor. In addition, the interconnection between the transistors Qs and Qd, the storage capacitor Cst, and the organic light emitting diode OLED may be different from what is shown.

The detailed structure of the organic light emitting diode display shown in FIG. 1 will now be described with reference to FIGS. 2 to 6.

Figure 2:
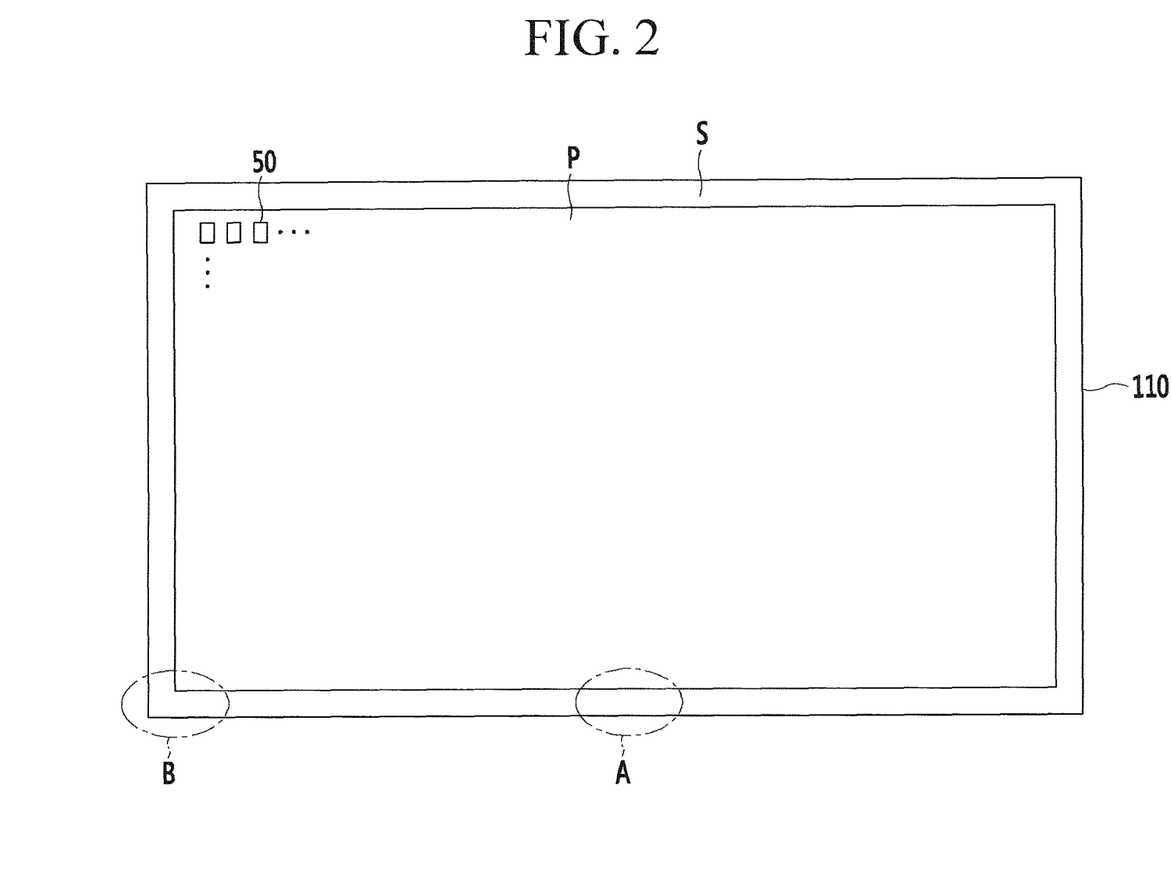
FIG. 2 is a top plan view of an organic light emitting diode display according to an exemplary embodiment.
Figure 3:
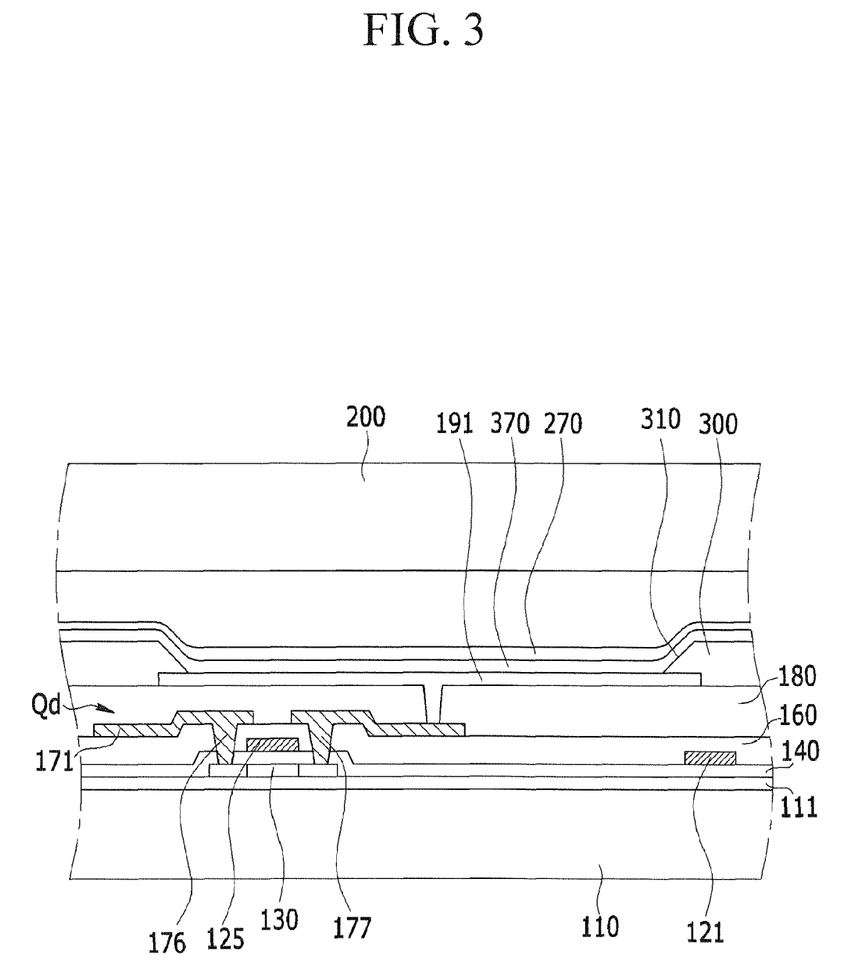
FIG. 3 is a cross-sectional view of a pixel region of FIG. 2.

FIG. 2 is a top plan view of an organic light emitting diode display according to an exemplary embodiment. FIG. 3 is a cross-sectional view of a pixel region of FIG. 2.

As shown in FIG. 2, an organic light emitting diode display according to an exemplary embodiment includes a pixel region P formed on a substrate 110 and having a plurality of pixels 50 each including an organic light emitting diode OLED and a peripheral region S surrounding the pixel portion P.

As shown in FIG. 3, the pixel region P includes a buffer film 111 formed on the substrate 110, a semiconductor layer 130 formed on the buffer film 111, and a gate insulating film 140 covering the semiconductor layer 130. A gate electrode 125, which may be a part of a gate line 121 for transmitting gate signals (or scan signals), may be formed on the gate insulating film 140, and an interlayer insulating film 160 may be formed to cover the gate line 121 and the gate electrode 125. A data line 171 for transmitting data signals, a source electrode 176, which may be a part of the data line 171, and a drain electrode 177 separated from the source electrode 176 are formed on the interlayer insulating film 160. The semiconductor layer 130, gate electrode 125, source electrode 176, and drain electrode 177 constitute a driving thin film transistor Qd, and the structure of a switching thin film transistor Qs is similar to that of the driving thin film transistor Qd. A protective film 180 may be formed on the source electrode 176, which may be a part of the data line 171, and the drain electrode 177 separated from source electrode 176, a pixel electrode 191 may be formed on the protective film 180 and connected to the driving thin film transistor Qd. The pixel electrode 191 may be made of a transparent conductive material, such as ITO or IZO. Barrier ribs 300 made of an organic film, etc are formed on the pixel electrode 191. The barrier ribs 300 have pixel openings 310 which surround the edges (or periphery) of the pixel electrode 191 and expose the pixel electrode 191. An organic emission layer 370 may be formed on the pixel electrode 191 exposed through the pixel openings 310 and the barrier ribs 300. The organic emission layer 370 may include additional layers (not shown) for improving the luminous efficiency of a light emitting layer, in addition to the light emitting layer. The additional layers may include one or more selected from the group consisting of an electron transport layer (ETL), a hole transport layer (HTL), an electron injection layer (EIL), and a hole injection layer (HIL). A common electrode 270 may be formed on the organic emission layer 370. The common electrode 270 may be made of a metal having high reflectivity. The common electrode 270 may be formed over the entire surface of the substrate, and may be paired with the pixel electrode 191 to allow a current to flow to the organic emission layer 370. The pixel electrode 191, organic emission layer 370, and common electrode 270 constitute an organic light emitting diode OLED. The pixel electrode 191 may be an anode and the common electrode 270 may be a cathode, or conversely the pixel electrode 191 may be a cathode and the common electrode 270 may be an anode.

An encapsulation member may be formed on the common electrode 270, and encapsulates the organic light emitting diode OLED.

The peripheral portion of the organic light emitting diode display according to an exemplary embodiment will be described below in detail.

Figure 4:
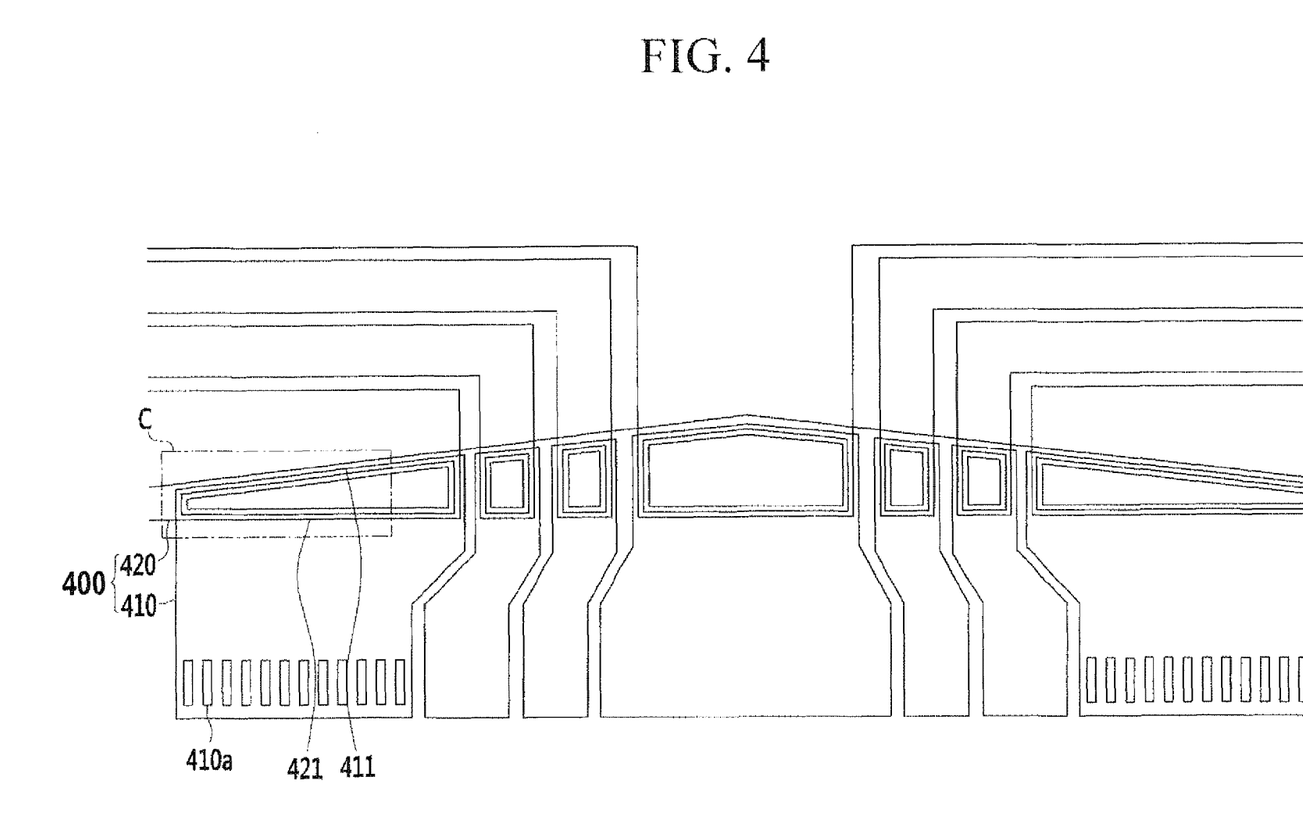
FIG. 4 is an enlarged top plan view of an edge portion A of the peripheral region of FIG. 2.
Figure 5:
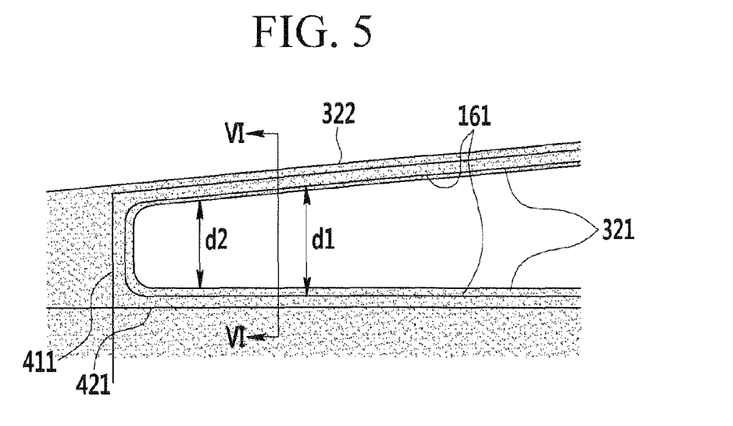
FIG. 5 is an enlarged top plan view of a portion C of the edge portion A of FIG. 4.
Figure 6:
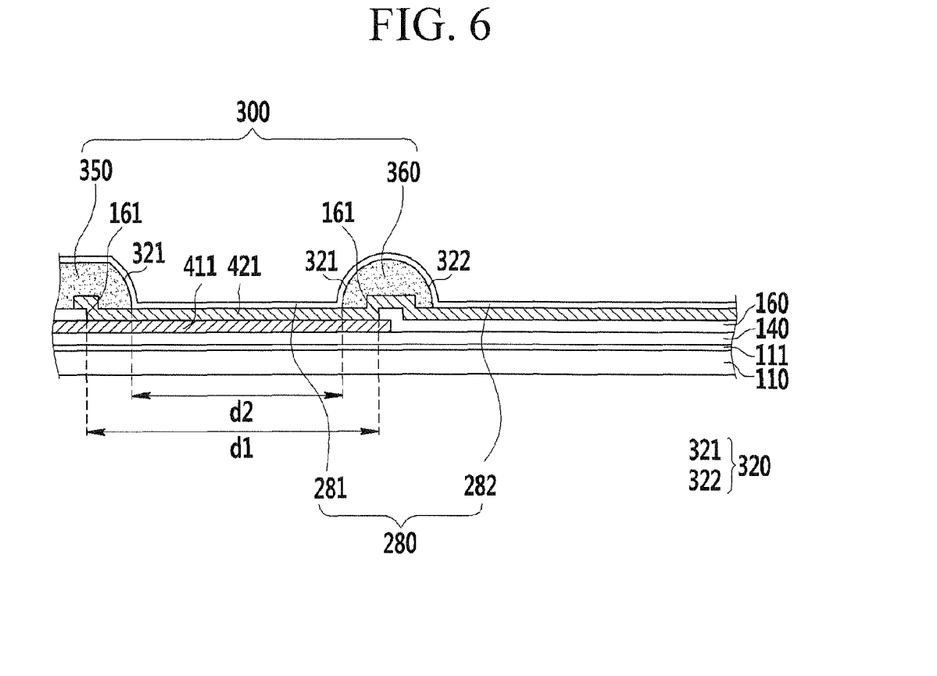
FIG. 6 is a cross-sectional view taken along line VI-VI of the peripheral region of FIG. 5.

FIG. 4 is an enlarged top plan view of an edge portion A of the peripheral region of FIG. 2. FIG. 5 is an enlarged top plan view of a portion C of the edge portion A of FIG. 4. FIG. 6 is a cross-sectional view taken along line VI-VI of the peripheral region of FIG. 5.

As shown in FIG. 2 and FIG. 4, a common voltage line 400 may be formed in the edge portion A of the peripheral region S to transmit a common voltage from an external source to the common electrode 270. The common voltage line 400 includes a gate common voltage line 410 formed on the same layer as the gate line 121 and receiving the common voltage from a flexible printed circuit (FPC) through a common voltage pad 410a and a data common voltage line 420 formed on the same layer as the data line 171 and receiving the common voltage by contact with the gate common voltage line 410. A gate common voltage contact portion 411, which may be a part of the gate common voltage line 410, and a data common voltage contact portion 421, which may be a part of the data common voltage line 420, are connected to each other via a common voltage contact hole.

A layer structure of the peripheral region of the organic light emitting diode display according to an exemplary embodiment will be described below in detail with reference to FIG. 5 and FIG. 6.

As shown in FIG. 5 and FIG. 6, the buffer film 111 may be formed on the substrate 110 in the peripheral region S, and the gate insulating film 140 may be formed on the buffer film 111. The gate common voltage line 410 may be formed on the gate insulating film 140, and the interlayer insulating film 160 having a common voltage contact hole 161 exposing the gate common voltage contact portion 411 of the gate common voltage line 410 may be formed on the gate insulating film 140 and the gate common voltage line 410 to cover the gate common voltage line 410.

The data common voltage line 420 may be formed on the interlayer insulating film 160, and the data common voltage contact portion 421 of the data common voltage line 420 overlapping the gate common voltage contact portion 411 comes in contact with the gate common voltage contact portion 411 via the common voltage contact hole 161.

The barrier ribs 300 are formed on the interlayer insulating film 160 and the data common voltage line 420. The barrier ribs 300 have common voltage openings 320 exposing the data common voltage contact portion 421. The common voltage openings 320 include a first common voltage opening 321 formed inside the common voltage contact hole 161 and a second common voltage opening 322 formed outside the common voltage contact hole 161. Accordingly, the width d1 of the common voltage contact hole 161 is larger than the width d2 of the first common voltage opening 321.

The barrier ribs 300 include a first barrier rib 350 overlapping an end portion of the data common voltage contact portion 421 and a second barrier rib 360 overlapping an end portion of the gate common voltage contact portion 411. The end portion of the data common voltage contact portion 421 and the end portion of the gate common voltage contact portion 411 are formed at positions corresponding to the boundaries Y1 and Y2 with the common voltage contact hole 161. Accordingly, the first barrier rib 350 and the second barrier rib 360 are formed at positions corresponding to the boundaries Y1 and Y2 with the common voltage contact hole 161. The first common voltage opening 321 may be formed between the first barrier rib 350 and the second barrier rib 360, and the second common voltage opening 322 may be formed between the second barrier rib 360 and the pixel region P.

A peripheral common electrode 280 may be formed on the barrier ribs 300 and the data common voltage contact portion 421. The peripheral common electrode 280 may be formed of the same material on the same layer as the common electrode 270 of the pixel region P, and connected to the common electrode 270. The peripheral common electrode 280 comes in contact with the data common voltage contact portion 421 via the common voltage openings 320. The peripheral common electrode 280 includes a first common electrode contact portion 281 and a second common electrode contact portion 282 which are connected to the data common voltage contact portion 421 via the first common voltage opening 321 and the second common voltage opening 322.

In this way, the data common voltage contact portion 421 and the peripheral common electrode 280 are connected together by using both of the first common voltage opening 321 formed inside the common voltage contact hole 161 and the second common voltage opening 322 formed outside the common voltage contact hole 161, thereby making the contact area between the data common voltage contact portion 421 and the peripheral common electrode 280 as large as possible.

Accordingly, the contact resistance between the data common voltage contact portion 421 and the peripheral common electrode 280 becomes as small as possible to thereby minimize heat generation. This minimizes voltage drop IR DROP, thus improving picture quality.

Moreover, the barrier ribs 300 are formed at positions corresponding to the boundary lines Y1 and Y2 with the common voltage contact hole 161 so that the peripheral common electrode 280 may be formed on the barrier ribs 300 at a gentle slope, thereby preventing short-circuiting of the peripheral common electrode 280.

While FIG. 4 to FIG. 6 illustrate the first common voltage opening 321 and second common voltage opening 322 formed in the edge portion A of the peripheral region, the first common voltage opening 321 and the second common voltage opening 322 also may be formed in a corner portion B of the peripheral region.

Figure 7:
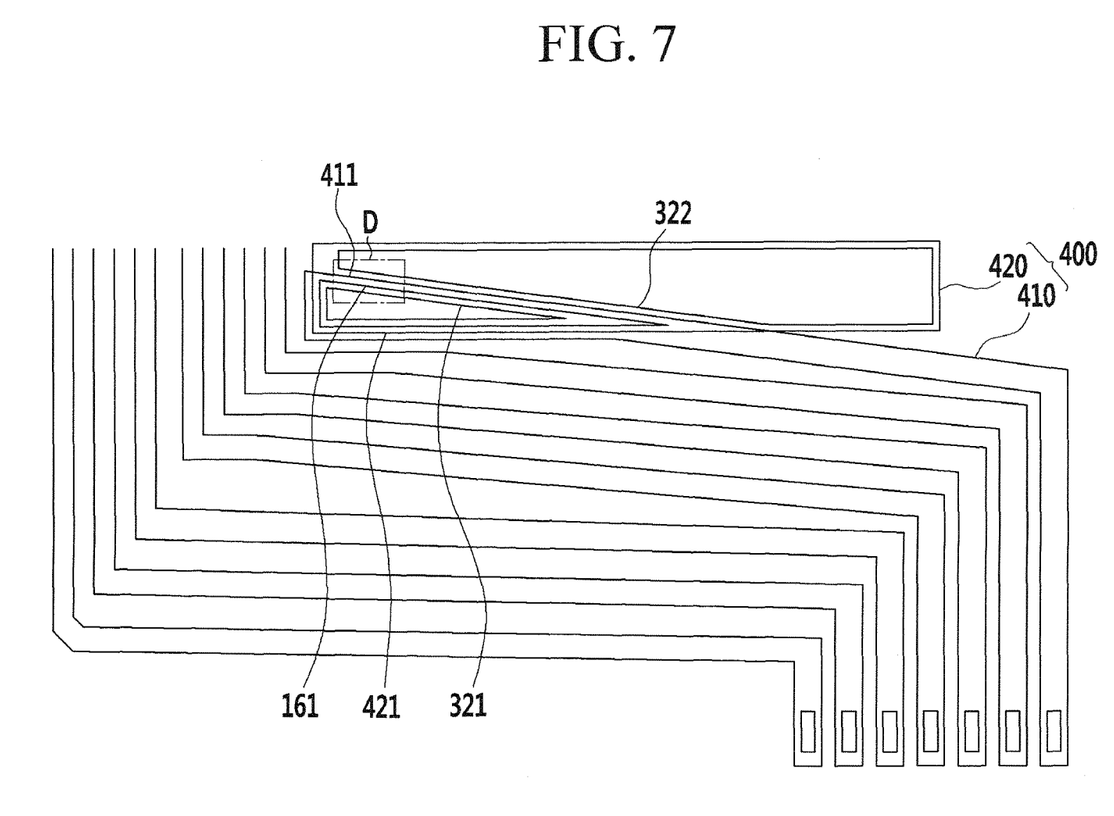
FIG. 7 is an enlarged top plan view of a corner portion B of the peripheral region of FIG. 2.
Figure 8:
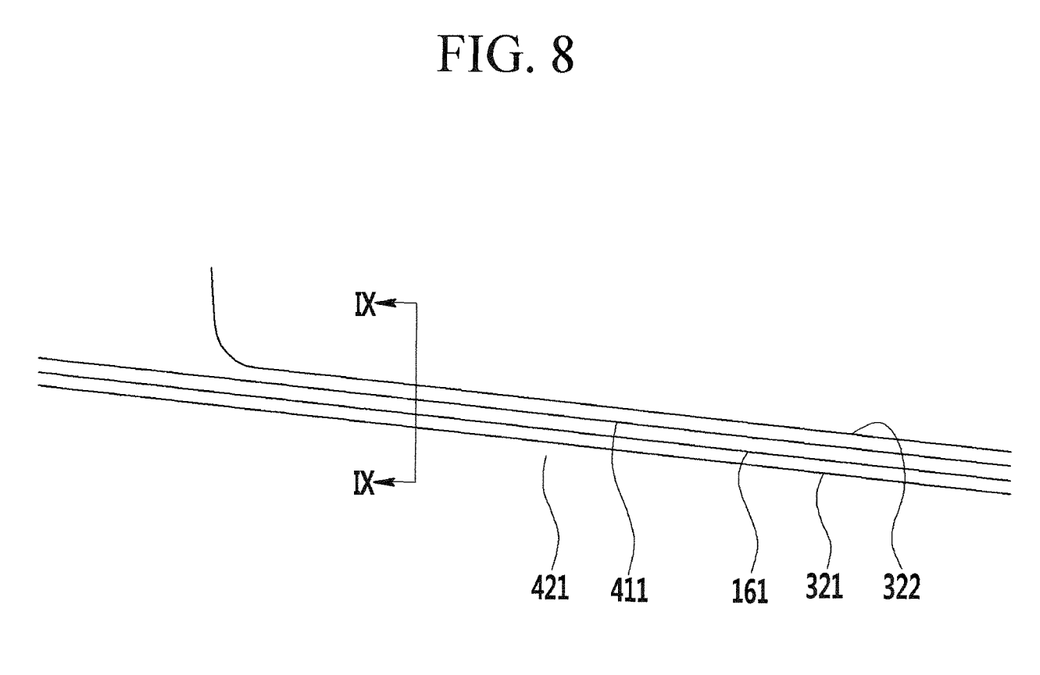
FIG. 8 is an enlarged top plan view of a portion D of the corner portion B of FIG. 7.
Figure 9:
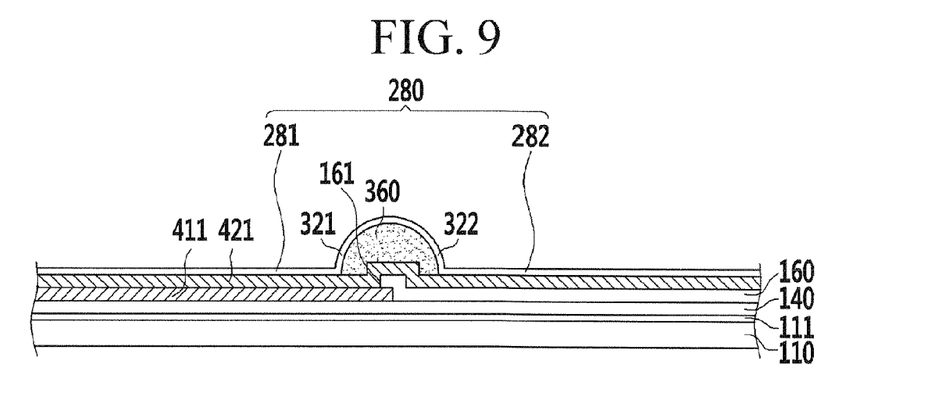
FIG. 9 is a cross-sectional view taken along line IX-IX of the peripheral region of FIG. 8.

FIG. 7 is an enlarged top plan view of a corner portion B of the peripheral region of FIG. 2. FIG. 8 is an enlarged top plan view of a portion D of the corner portion B of FIG. 7. FIG. 9 is a cross-sectional view taken along line IX-IX of the peripheral region of FIG. 8.

As shown in FIG. 7 and FIG. 9, a common voltage line 400 may be formed in the corner portion B of the peripheral region S to transmit a common voltage from the flexible printed circuit to the common electrode 270. The common voltage line 400 includes a gate common voltage line 410 formed on the same layer as the gate line 121 and receiving the common voltage from the flexible printed circuit through a common voltage pad 410a and a data common voltage line 420 formed on the same layer as the data line 171 and receiving the common voltage by contact with the gate common voltage line 410. A gate common voltage contact portion 411, which may be a part of the gate common voltage line 410, and a data common voltage contact portion 421, which may be a part of the data common voltage line 420, are connected to each other via a common voltage contact hole.

The buffer film 111 may be formed on the substrate 110 in the corner portion B of the peripheral region S, and the gate insulating film 140 may be formed on the buffer film 111. The gate common voltage line 410 may be formed on the gate insulating film 140, and the interlayer insulating film 160 having a common voltage contact hole 161 exposing the gate common voltage contact portion 411 of the gate common voltage line 410 may be formed on the gate insulating film 140 and the gate common voltage line 410 to cover the gate common voltage line 410. The data common voltage line 420 may be formed on the interlayer insulating film 160, and the data common voltage contact portion 421 of the data common voltage line 420 overlapping the gate common voltage contact portion 411 comes in contact with the gate common voltage contact portion 411 via the common voltage contact hole 161. The barrier ribs 300 are formed on the interlayer insulating film 160 and the data common voltage line 420. The barrier ribs 300 have common voltage openings 320 exposing the data common voltage contact portion 421. The common voltage openings 320 include a first common voltage opening 321 formed inside the common voltage contact hole 161 and a second common voltage opening 322 formed outside the common voltage contact hole 161. Accordingly, the barrier ribs 300 are formed at positions corresponding to the boundary lines Y1 and Y2 with the common voltage contact hole 161. A peripheral common electrode 280 may be formed on the barrier ribs 300 and the data common voltage contact portion 421. The peripheral common electrode 280 comes in contact with the data common voltage contact portion 421 via the common voltage openings 320. The peripheral common electrode 280 includes a first common electrode contact portion 281 and a second common electrode contact portion 282 which are connected to the data common voltage contact portion 421 via the first common voltage opening 321 and the second common voltage opening 322.

In this way, the data common voltage contact portion 421 and the peripheral common electrode 280 are connected together by forming the common voltage openings 320 including the first common voltage opening 321 and the second common voltage opening 322 in the corner portion B of the peripheral region S, thereby making the contact area between the data common voltage contact portion 421 and the peripheral common electrode 280 as large as possible.

Moreover, the barrier ribs 300 formed in the corner portion B of the peripheral region S are formed at positions corresponding to the boundaries Y1 and Y2 with the common voltage contact hole 161 so that the peripheral common electrode 280 may be formed on the barrier ribs 300 at a gentle slope, thereby preventing short-circuiting of the peripheral common electrode 280.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:
1. An organic light emitting diode display, comprising:
   a pixel region formed on a substrate and comprising an organic light emitting diode for displaying an image; and
   a peripheral region surrounding the pixel region,
   the peripheral region comprising:
   a gate common voltage line formed on the substrate and transmitting a common voltage from an external source;
   an interlayer insulating film that covers the gate common voltage line and has a common voltage contact hole exposing part of the gate common voltage line;

a data common voltage line that is formed on the interlayer insulating film and comes in contact with the gate common voltage line via the common voltage contact hole;

barrier ribs that cover the data common voltage line and have common voltage openings exposing part of the data common voltage line; and a peripheral common electrode that is formed on the barrier ribs and comes in contact with the data common voltage line via the common voltage openings, wherein the barrier ribs are formed at positions corresponding to the boundaries with the common voltage contact hole.

2. The organic light emitting diode display of claim 1, wherein the common voltage openings comprise:

a first common voltage opening formed inside the common voltage contact hole; and a second common voltage opening formed outside the common voltage contact hole.

3. The organic light emitting diode display of claim 2, wherein a gate common voltage contact portion, which is a part of the gate common voltage line, and a data common voltage contact portion, which is a part of the data common voltage line, are connected to each other via the common voltage contact hole.

4. The organic light emitting diode display of claim 3, wherein a first common electrode contact portion and a second common electrode contact portion, which are part of the peripheral common electrode, are connected to the data common voltage contact portion via the first common voltage opening and the second common voltage opening.

5. The organic light emitting diode display of claim 3, wherein the barrier ribs comprise:

a first barrier rib overlapping an end portion of the data common voltage contact portion; and a second barrier rib overlapping an end portion of the gate common voltage contact portion, and the first common voltage opening is formed between the first barrier rib and the second barrier rib, and the second common voltage opening is formed between the second barrier rib and the pixel region.

6. The organic light emitting diode display of claim 5, wherein the end portion of the data common voltage contact portion and the end portion of the gate common voltage contact portion are formed at positions corresponding to the boundaries with the common voltage contact hole.

7. The organic light emitting diode display of claim 1, wherein the common voltage openings are positioned in a corner portion of the peripheral region.

8. The organic light emitting diode display of claim 1, wherein the common voltage openings are positioned in an edge portion of the peripheral region.

9. The organic light emitting diode display of claim 1, wherein the pixel region comprises:

a gate line that is formed on the substrate and transmitting scan signals;

a data line and a driving voltage line that are insulated from and intersect the gate line and transmit data signals and driving voltages, respectively;

a switching thin film transistor connected to the gate line and the data line;

a driving thin film transistor connected to the switching thin film transistor and the driving voltage line;

a pixel electrode connected to the driving thin film transistor;

an organic light emitting diode formed on the pixel electrode; and a common electrode formed on the organic light emitting diode, wherein the gate common voltage line is formed on the same layer as the gate line, and the data common voltage line is formed on the same layer as the data line.

10. The organic light emitting diode display of claim 9, wherein the common electrode and the peripheral common electrode may be connected to each other.

11. The organic light emitting diode display of claim 2, wherein a width of the common voltage contact hole is larger than a width of the first common voltage opening.

* * * * *